United States Patent
Kawakami

(10) Patent No.: US 7,399,703 B2
(45) Date of Patent: Jul. 15, 2008

(54) PROCESS FOR PATTERNING NANOCARBON MATERIAL, SEMICONDUCTOR DEVICE, AND METHOD FOR MANUFACTURING SEMICONDUCTOR DEVICE

(75) Inventor: Soichiro Kawakami, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 222 days.

(21) Appl. No.: 11/138,331

(22) Filed: May 27, 2005

(65) Prior Publication Data

US 2005/0266605 A1  Dec. 1, 2005

(30) Foreign Application Priority Data

Jun. 1, 2004  (JP)  ............... 2004-162966

(51) Int. Cl.
*H01L 21/30* (2006.01)
(52) U.S. Cl. .............. 438/669; 438/710; 977/842; 257/E21.314
(58) Field of Classification Search ......... 438/669, 438/710; 977/842
See application file for complete search history.

(56) References Cited

U.S. PATENT DOCUMENTS

| | | | | |
|---|---|---|---|---|
| 5,011,569 A | * | 4/1991 | Kittler et al. ............... 216/87 |
| 5,277,786 A | | 1/1994 | Kawakami ................ 205/124 |
| 5,296,043 A | | 3/1994 | Kawakami et al. .......... 136/244 |
| 6,620,351 B2 | * | 9/2003 | Gupta et al. ................. 264/7 |
| 6,878,361 B2 | * | 4/2005 | Clarke et al. ............... 423/461 |
| 2004/0043219 A1 | * | 3/2004 | Ito et al. .................... 428/408 |

FOREIGN PATENT DOCUMENTS

JP  2002-75960  3/2002

* cited by examiner

*Primary Examiner*—Alexander G Ghyka
(74) *Attorney, Agent, or Firm*—Fitzpatrick, Cella, Harper & Scinto

(57) ABSTRACT

A process for patterning a nanocarbon material includes a step of forming a nanocarbon layer on a substrate; a step of forming a first metal layer on the nanocarbon layer to pattern the first metal layer, the first metal layer containing at least one selected from the group consisting of zinc, tin, indium, aluminum, and titanium; and a step of etching the nanocarbon layer with oxygen plasma using the first metal layer as a positive pattern. Also, a method for manufacturing a semiconductor device including a semiconductor layer containing a nanocarbon material includes a step of patterning a nanocarbon material by the above process; and, a semiconductor device containing a nanocarbon material includes a semiconductor layer including a nanocarbon sub-layer patterned by the process.

8 Claims, 6 Drawing Sheets

PROCESS FOR PATTERNING NANOCARBON MATERIAL, SEMICONDUCTOR DEVICE, AND METHOD FOR MANUFACTURING SEMICONDUCTOR DEVICE

BACKGROUND OF THE INVENTION

1. Field of the Invention

The present invention relates to a process for patterning a nanocarbon material, a semiconductor device including a patterned nanocarbon material, and a method for manufacturing such a semiconductor device.

2. Description of the Related Art

Since H. W. Kroto, R. E. Smalley, and R. F. Curl discovered soccer ball-shaped molecules, called fullerenes, consisting of 60 carbon atoms in 1985 and S. Iijima discovered tubular structures, called carbon nanotubes, including rolled graphene sheets in 1991, various applications of these materials have been actively investigated.

The carbon nanotubes have excellent field emission properties, high heat conductivity, low weight, and high density; intercalate or deintercalate lithium ions due to electrochemical reaction; act as conductors or semiconductors depending on their chirality; and provide high-density currents. Therefore, carbon nanotubes have been investigated for applications in electrodes for display devices such as field emission displays (FEDs), applications in electrodes for lithium secondary batteries, applications in semiconductor devices such as field effect transistors, and applications in mechanical components.

In order to form channel layers or wiring layers containing the carbon nanotubes to manufacture semiconductor devices such as FETs, the following procedure is usually used to form carbon nanotube patterns: (i) a procedure including a step of forming a catalyst layer containing a transition metal element for selectively growing carbon nanotubes on a wafer to pattern the catalyst layer and a step of forming a carbon nanotube layer on the resulting catalyst layer by a chemical vapor deposition (CVD) process such as a plasma-enhanced CVD process or a thermal CVD process using a source gas containing hydrocarbon or (ii) a procedure including a step of forming negative patterns on a wafer using a photoresist material, a step of forming a carbon nanotube layer over the negative patterns and the wafer, and a step of removing the negative patterns and portions of the carbon nanotube layer that lie on the negative patterns by a lift-off process.

Procedure (i) has problems in that conditions for selectively growing the carbon nanotubes must be found, it is difficult to remove the catalyst layer on which the carbon nanotube layer is placed, and configurations of the devices are therefore limited. Procedure (ii) has a problem in that the temperature at which the carbon nanotube layer is formed must be lower than the heat-resistant temperature of the resist material.

Japanese Patent Laid-Open No. 2002-75960 discloses a technique for etching a carbonaceous material such as diamond-like carbon, carbon nanotube, fullerene, or graphite using a mask made of a material, resistant to oxygen plasma, containing an oxide such as silicon dioxide. For this technique, a process for forming the mask is, however, limited to a sputtering process or a CVD process using an organometallic compound. The technique therefore has a problem in that it is difficult to form an oxide layer for forming the mask without damaging a nanocarbon material and also has a problem in that such a nanocarbon material is deteriorated or damaged during the etching of the oxide layer. In particular, when the oxide layer is formed on the nanocarbon material by a sputtering process, the following problems occur: damages due to argon ions, the oxidation of the nanocarbon material, and the formation of a nonuniform oxide layer. When a silicon dioxide layer is formed by a CVD process using a compound such as tetraethoxysilane, the layer usually contains carbon and uniform layer, resistant to oxygen plasma, is therefore difficult to form. Furthermore, when the mask is removed by a dry etching process using halogen plasma, insulating films containing halogen are usually formed on the nanocarbon material.

Accordingly, the following process has been demanded: a process for patterning a nanocarbon material without deteriorating or damaging the material. Such a process is useful in manufacturing high-performance devices such as field effect transistors (FETs) and FEDs containing a nanocarbon material such as carbon nanotubes.

SUMMARY OF THE INVENTION

The present invention has been made to solve the above problems and provides a process for patterning a nanocarbon material. The process is useful in manufacturing devices such as FETs and FEDs containing a nanocarbon material such as carbon nanotubes.

The present invention provides a high-performance semiconductor device, such as a FET or a FED, containing a nanocarbon material.

In particular, the present invention provides a process, for patterning a nanocarbon material, including a step of forming a nanocarbon layer on a substrate; a step of forming a first metal layer on the nanocarbon layer to pattern the first metal layer, the first metal layer containing at least one selected from the group consisting of zinc, tin, indium, aluminum, and titanium; and a step of etching the nanocarbon layer with oxygen plasma using the first metal layer as a positive pattern.

In the above process, the step of forming the nanocarbon layer preferably includes a sub-step of applying a dispersion containing a nanocarbon material onto the substrate to heat-treat the substrate. The dispersion is preferably prepared by heat-treating a mixture at high temperature and pressure, the mixture containing the nanocarbon material, a solvent, a surfactant, and a compound at least one selected from the group consisting of a calixarene, cyclodextrin, and cyclophane. The dispersion is preferably prepared by treating the mixture at a temperature higher than the critical temperature of the solvent under supercritical conditions. The first metal layer treated with the oxygen plasma is preferably etched off with acid and/or alkali. The nanocarbon material is preferably carbon nanotubes.

The present invention provides a method for manufacturing a semiconductor device which includes a semiconductor layer containing a nanocarbon material or which includes a wire or electrode including a conductor layer containing a nanocarbon material. This method includes a step of patterning a nanocarbon material by the process.

The present invention provides a semiconductor device, containing a nanocarbon material, including a semiconductor layer including a nanocarbon sub-layer patterned by the process; and, provides a semiconductor device including a wire or electrode including a conductor layer containing a nanocarbon material, the wire or the electrode including a nanocarbon layer patterned by the process. In this device, it is preferable that the wire or the electrode further includes a second metal layer containing copper or aluminum and has a multilayer structure.

Further features and advantages of the present invention will become apparent from the following description of exemplary embodiments with reference to the attached drawings.

DESCRIPTION OF THE EMBODIMENTS

Figure 1:
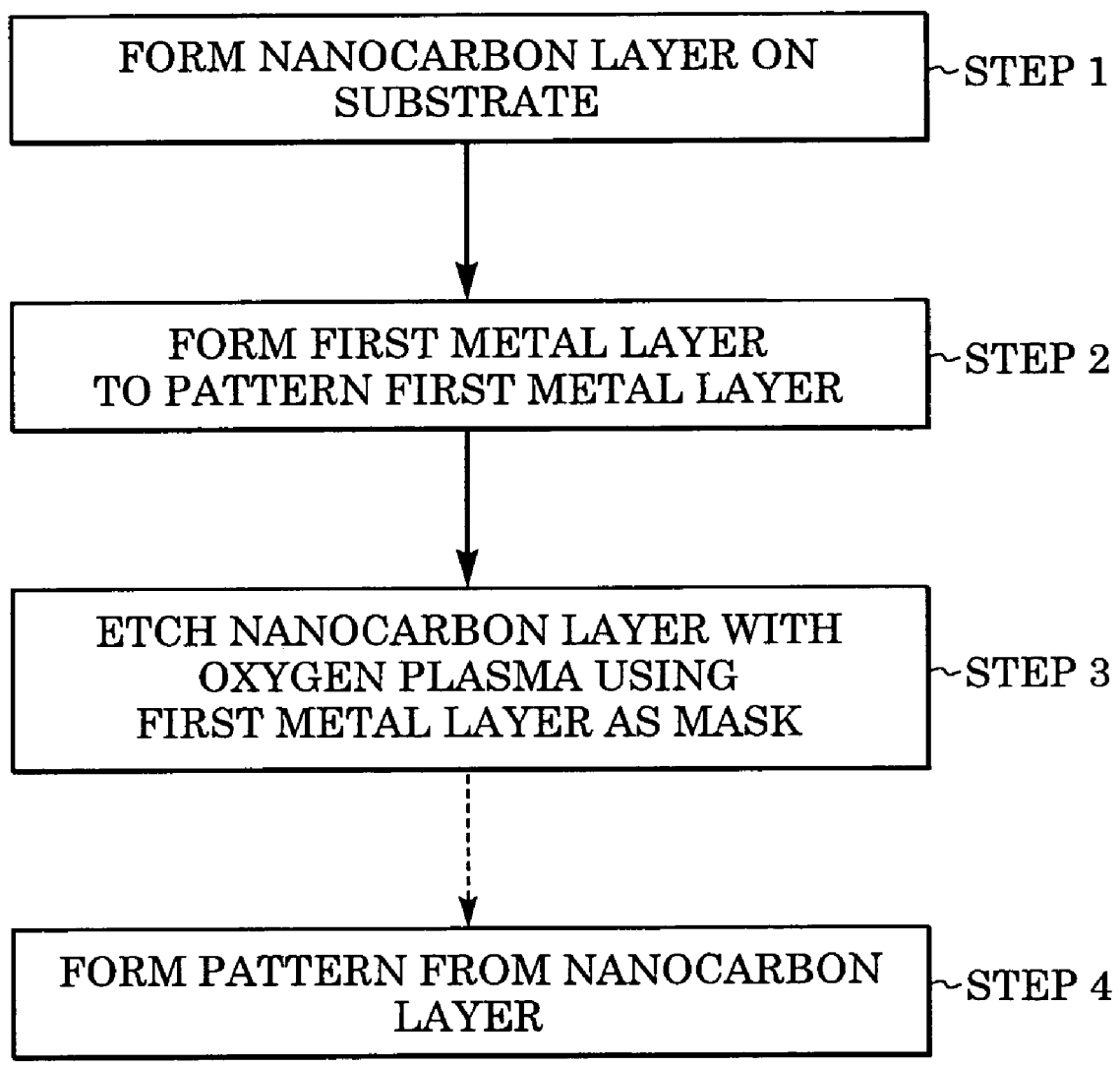
FIG. 1 is a flow chart showing an example of a process for patterning a nanocarbon layer according to the present invention.

A process for patterning a nanocarbon material according to the present invention includes a step of forming a nanocarbon layer on a substrate; a step of forming a first metal layer on the nanocarbon layer to pattern the first metal layer, the first metal layer containing at least one selected from the group consisting of zinc, tin, indium, aluminum, and titanium; and a step of etching the nanocarbon layer with oxygen plasma using the first metal layer as a positive pattern.

The inventors have investigated materials for a mask used to form a pattern by etching a nanocarbon layer with oxygen plasma and have found that metal materials such as zinc, tin, indium, aluminum, and titanium are suitable for such a mask. These metal materials can be readily formed into uniform films by an electron beam evaporation process or another process. The inventors have also found that when a mask containing zinc, tin, indium, aluminum, or titanium is placed on a nanocarbon material such as carbon nanotubes, the mask can be dissolved in an acidic solution or an alkaline solution and can therefore be readily removed using one of such solutions although the mask is partly oxidized due to the contact with oxygen plasma. In particular, when the mask contains zinc, the mask is soluble in both an acidic solution and an alkaline solution and can be readily removed using one of the solutions. When the mask contains aluminum, thin aluminum oxide films are present on the mask; hence, the mask is not further oxidized even if the mask is in contact with oxygen plasma and can therefore be removed using an acidic or alkaline solution after the oxygen plasma treatment is performed. When the mask contains titanium, thin titanium oxide films are present on the mask; hence, the mask is not further oxidized even if the mask is in contact with oxygen plasma and can therefore be removed using hydrofluoric acid after the oxygen plasma treatment is performed.

On the other hand, when the mask contains copper or nickel, the mask is oxidized due to contact with oxygen plasma, whereby copper oxide or nickel oxide is created, respectively. Copper oxide and nickel oxide are not substantially soluble in either an acidic nor alkaline solution. When the mask contains tungsten or molybdenum, the mask is oxidized due to contact with oxygen plasma, whereby tungsten oxide or molybdenum oxide is created, respectively, which can be removed using aqueous hydrogen peroxide. However, when the nanocarbon material has amorphous portions, a pattern having nonuniform sections is formed from the nanocarbon material; that is, a high-definition pattern is difficult to form from the nanocarbon material. This is because since amorphous carbon is oxidized by hydrogen peroxide, such portions containing amorphous carbon are removed by oxidation when regions containing tungsten oxide or molybdenum oxide are etched.

Nanocarbon Material

A nanocarbon material used herein is defined as a carbon material with a size of several nanometers to several hundred nanometers. Typical examples of such a carbon material include carbon nanotubes, carbon nanofibers, carbon nonocoils, fullerene, fullerene derivatives, diamond, diamond-like carbon, and graphite.

Carbon Nanotube

Carbon nanotubes are typical of the nanocarbon material and are classified into three types depending on the chirality: an armchair type, a zigzag type, and a chiral type. An armchair type of nanotube is metallic and a zigzag type of nanotube is semiconductive.

A chiral type of nanotube can be formed on a monocrystalline silicon carbide wafer by thermal decomposition.

Metallic carbon nanotubes and semiconductive carbon nanotubes can be isolated from DNA-coated carbon nanotubes by ion-exchange liquid chromatography.

Such metallic carbon nanotubes can be isolated from carbon nanotubes dispersed in a surfactant solution by an electrophoretic process in such a manner that an alternating current is applied to the dispersion containing the carbon nanotubes.

Procedure for Forming Nanocarbon Layer

In the present invention, examples of a technique for forming a nanocarbon layer include a first technique for forming a nanocarbon layer on a substrate by a CVD process using graphite or hydrocarbon which is a starting material for the synthesis of nanocarbon and a second technique for applying a dispersion, prepared in advance, containing a nanocarbon material onto a substrate to heat-treat the resulting substrate. The second technique is preferable because this technique can be performed at low temperature.

Examples of a procedure for preparing a dispersion containing carbon nanotubes include the procedures below.

(i) Terminal groups of carbon nanotubes are modified with carboxylic acid by ultrasonically treating the carbon nanotubes placed in a solution containing a strong acid such as nitric acid. The resulting carbon nanotubes are treated with thionyl chloride and then allowed to react with an alkylamine such as octadodecylamine. The carbon nanotubes chemically modified are dispersed in an organic solvent such as benzene or toluene, whereby a dispersion containing the carbon nanotubes is prepared.

(ii) Carbon nanotubes are dispersed in an aqueous solution containing a water-soluble polymer such as polyvinyl alcohol, poly(N-vinylpyrrolidone), poly(2-methyl-2-oxazoline), or poly(N,N-dimethylacrylamide). In particular, the carbon nanotubes and a surfactant are mixed with a solvent such as water and the mixture is ultrasonically treated. Poly(N-vinylpyrrolidone) or another polymer is added to the mixture, whereby the carbon nanotubes are coated with the polymer. This leads to the preparation of a dispersion containing the carbon nanotubes.

(iii) Carbon nanotubes are dispersed in an aqueous solution containing deoxyribonucleic acid (DNA) and the resulting solution is ultrasonically treated, whereby a dispersion containing the carbon nanotubes coated with the DNA is prepared.

(iv) A blend containing water and carbon nanotubes dispersed therein is prepared by ultrasonic treatment and then mixed with a solution of amylose in dimethyl sulfoxide (DMSO). The resulting mixture is ultrasonically treated, whereby a dispersion containing the carbon nanotubes is prepared.

(v) Carbon nanotubes are mixed with a solvent such as paraffinic hydrocarbon with 15 to 40 carbon atoms or alcohol with 15 to 40 carbon atoms and the mixture is ultrasonically treated, whereby a dispersion containing the carbon nanotubes is prepared.

(vi) Carbon nanotubes are mixed with a solution containing a solvent and at least one selected from the group consisting of a titanate coupling agent, an aluminum coupling agent, and a silane coupling agent. The mixture is preferably ultrasonically treated, whereby a dispersion containing the carbon nanotubes is prepared. The titanate and aluminum coupling agents are preferable and the titanate coupling agent is more preferable.

(vii) Carbon nanotubes are mixed with a blend containing a surfactant, a solvent such as water, and at least one selected from the group consisting of a calixarene, cyclodextrin, and cyclophane. The mixture is placed in a pressure vessel, which is then hermetically sealed. The mixture is treated at high temperature and pressure, whereby a dispersion containing the carbon nanotubes is prepared. The mixture is preferably treated at a temperature higher than the critical temperature of the solvent under supercritical conditions. This procedure can be used to prepare a dispersion containing another carbon material.

Procedures (v), (vi), and (vii) are preferable and procedures (vi) and (vii) are more preferable.

In order to prepare a uniform dispersion, the carbon nanotubes are preferably refined in advance.

A solution containing fullerene, which is typical of the nanocarbon material, can be prepared by dissolving fullerene in a solvent such as toluene, benzene, cyclohexane, or carbon tetrachloride.

A solution or dispersion containing the nanocarbon material is applied onto a substrate, which is then heat-treated. The temperature of the heat treatment is preferably higher than the boiling point of a solvent contained in the solution or the dispersion and lower than the decomposition temperature of the nanocarbon material. When the dispersion prepared by procedure (ii) is used, the heat treatment temperature is preferably higher than the decomposition temperature of the polymer and lower than the decomposition temperature of the nanocarbon material. In particular, when the nanocarbon material has a high molecular weight, the heat treatment temperature is preferably 100° C. or more and less than 800° C. and more preferably 200° C. or more and less than 600° C. When the nanocarbon material is fullerene or a fullerene derivative and therefore has low molecular weight, the heat treatment temperature is preferably 100° C. or more and less than 400° C. and more preferably 200° C. or more and less than 300° C. The heat treatment is preferably performed in an inert atmosphere such as nitrogen or argon. The heat treatment is, however, preferably performed in an atmosphere containing oxygen if the dispersion prepared by procedure (ii) is used, because the polymer can be readily thermally decomposed.

Technique for Forming First Metal Layer for Preparing Mask

The first metal layer, which contains at least one selected from the group consisting of zinc, tin, indium, aluminum, and titanium as described above, can be formed by an electron beam evaporation process in such a manner that an electron beam is applied to a metal material in vacuum and the substrate is opposed to the metal material. If the nanocarbon layer is used to prepare an electrode or a wire, a second metal layer containing copper or aluminum may be placed between the first metal layer and the nanocarbon layer. Since the second metal layer and the nanocarbon layer form a multilayer structure, a flat wire with high durability can be fabricated.

Technique for Patterning First Metal Layer

When the pattern size is large, the first metal layer is patterned in such a manner that a mask is bonded to the nanocarbon layer before the first metal layer is formed on the nanocarbon layer. When the pattern size is fine, the first metal layer is patterned in such a manner that a positive photoresist is provided on the first metal layer and then exposed with a mask aligner so as to form a desired pattern, a positive pattern is formed by developing the resulting photoresist, the first metal layer is etched using the positive pattern as a mask, and the photoresist having the positive pattern is then removed with a solution containing a release agent, whereby a positive pattern used for oxygen plasma etching is formed from the first metal layer. The first metal layer may be wet-etched using an aqueous solution containing acid or alkali or dry-etched with a reactive etching system using etching gas containing a halogen compound such as $CF_4$ or $CCl_2F_2$. The photoresist may be removed by an etching process using oxygen plasma.

Technique for Patterning Nanocarbon Layer

The nanocarbon layer is patterned in such a manner that the substrate is placed in a dry etching system, oxygen plasma is applied to the nanocarbon layer using the first metal layer having the positive pattern as a mask, and portions of the nanocarbon layer that are exposed from the positive pattern are etched off. The oxygen plasma is generated in such a manner that oxygen is fed to a chamber included in the dry etching system and a discharge is performed in the chamber under vacuum conditions using microwaves or high-frequency waves such as radio waves. In order to promote the generation of the oxygen plasma, argon may be mixed with oxygen. Although the first metal layer is partly oxidized by the oxygen plasma, the first metal layer can be removed using acid or alkali, whereby a pattern can be formed from the nanocarbon layer. The first metal layer preferably contains zinc or aluminum and more preferably zinc because the first metal layer can be readily removed.

A device taking advantage of the nanocarbon layer can be prepared by patterning the nanocarbon layer by the above procedure to form semiconductive regions or electrical wires.

FIG. 1 is a flow chart showing an example of the process of the present invention.

In Step 1 shown in FIG. 1, a dispersion, prepared by any one of the procedures described above, containing a nanocarbon material is applied onto a substrate such as a silicon substrate or a glass substrate with a coater or the like and the resulting substrate is heat-treated, whereby a nanocarbon layer is formed on the substrate. The heat treatment is preferably performed at a temperature of 100° C. to 600° C. in an inert atmosphere such as nitrogen or argon.

The dispersion may further contain a compound, such as liquid crystal, an amphipathic surfactant, or a polyethylene oxide-polypropylene oxide block copolymer, for promoting the orientation, the compound being hereinafter referred to as an orientation promoter. The nanocarbon layer can be oriented by heat-treating the substrate coated with the dispersion to remove the orientation promoter from the substrate. This technique is effective when the performance of the oriented nanocarbon layer is higher than that of a non-oriented nanocarbon layer.

In Step 2, a first metal layer is formed on the nanocarbon layer and then patterned. The first metal layer can be formed by an electron beam evaporation process, a resistive heating evaporation process, or a sputtering process. The first metal layer can be patterned by the following procedure: (a) a mask having a pattern opposite to a desired pattern is bonded to the nanocarbon layer and a metal material for forming the first metal layer is then deposited on the nanocarbon layer or (b) a photoresist is provided on the first metal layer and then patterned so as to have a positive pattern and the first metal layer is etched with acid, fluorine radicals, or the like using the photoresist as a mask.

In Step 3, the nanocarbon layer is etched with oxygen plasma using the first metal layer having a pattern formed in Step 2 as a mask.

In Step 4, the first metal layer used as a mask during etching is removed with an acidic or alkaline solution as required, whereby a pattern is formed from the nanocarbon layer.

Two particular procedures for patterning the nanocarbon layer will now be described with reference to FIGS. 2A to 2F and 3A to 3F. The procedure including steps shown in FIGS. 3A to 3F is different from the procedure including steps shown in FIGS. 2A to 2F in that the latter procedure includes a step of forming a second metal layer on a nanocarbon layer.

Figure 2A:
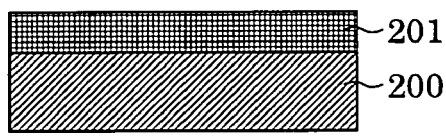
FIGS. 2A to 2F show steps of an example of the process of the present invention.

In the step shown in FIG. 2A, a dispersion containing a nanocarbon material is applied onto a substrate 200, which is then heat-treated, whereby a nanocarbon layer 201 is formed on the substrate 200.

Figure 2B:
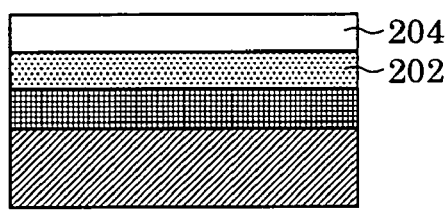
Figure 3B:
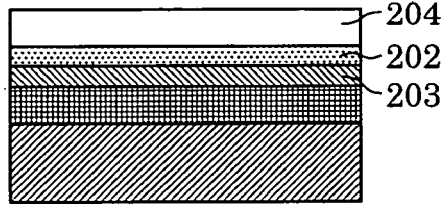

In the step shown in FIG. 2B, a first metal layer 202 is formed on the nanocarbon layer 201 by a vacuum vapor deposition process. The first metal layer 202 contains at least one selected from the group consisting of zinc, tin, indium, aluminum, and titanium. A solution containing a positive photoresist is applied onto the first metal layer 202, which is then dried, whereby a photoresist layer 204 is formed on the first metal layer 202.

Figure 2C:
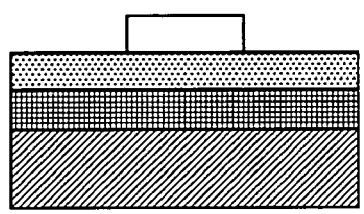

In the step shown in FIG. 2C, the photoresist layer 204 is exposed with a mask aligner and then developed with a developing solution, whereby a positive pattern is formed from the photoresist layer 204.

Figure 2D:
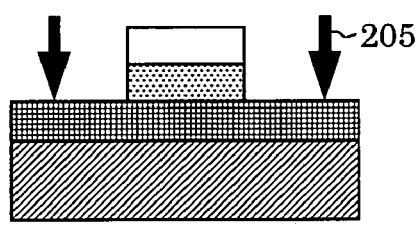
Figure 3D:
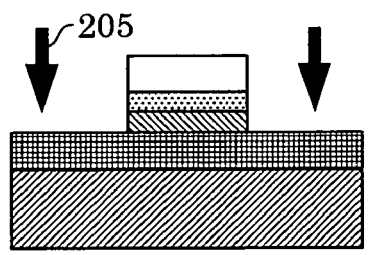

In the step shown in FIG. 2D, the first metal layer 202 is etched with an acidic solution using the positive pattern as a mask.

Figure 2E:
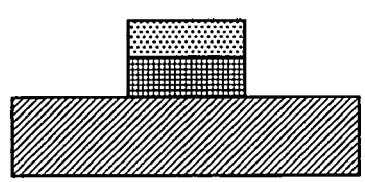

In the step shown in FIG. 2E, the substrate 200 is placed in a dry etching system and the nanocarbon layer 201 is then etched with oxygen plasma 205 created from oxygen by causing a discharge using high-frequency waves or microwaves.

Figure 2F:
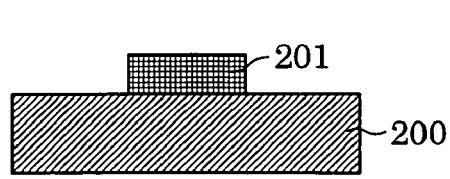
Figure 3F:
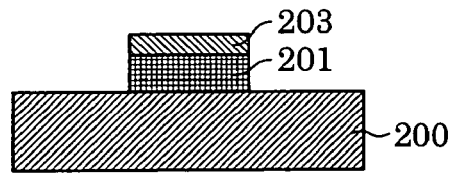

In the step shown in FIG. 2F, the first metal layer 202 is etched off with an acidic or alkaline solution, whereby the nanocarbon layer 201 is patterned.

In the step shown in FIG. 2D, the first metal layer 202 may be etched with fluorine radicals or fluorine ions created from carbon fluoride such as $CF_4$ by causing a discharge using high-frequency waves or microwaves in such a manner that the substrate 200 is placed in a dry etching system. Although the photoresist layer 204 is removed with the oxygen plasma 205 in the step shown in FIG. 2E, the photoresist layer 204 may be removed with a release agent before the step shown in FIG. 2E is performed.

Figure 3A:
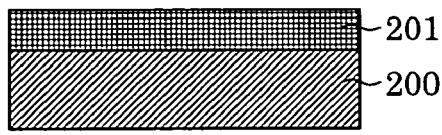
FIGS. 3A to 3F show steps of another example of the process of the present invention.
Figure 3C:
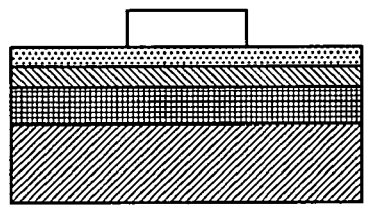
Figure 3E:
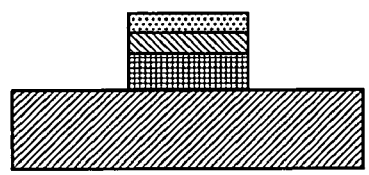

The step shown in FIG. 3A is substantially the same as the step shown in FIG. 2A. In the step shown in FIG. 3B, a second metal layer 203 and a first metal layer 202 are formed on a nanocarbon layer 201 in that order. The first metal layer 202 contains at least one selected from the group consisting of zinc, tin, indium, aluminum, and titanium. The second metal layer 203 contains at least one of copper and aluminum. The step shown in FIG. 3C is substantially the same as the step shown in FIG. 2C. In the step shown in FIG. 3D, the first and second metal layers 202 and 203 are etched with an acidic solution using a positive pattern, formed from a photoresist layer 204, as a mask. The step shown in FIG. 3E is substantially the same as the step shown in FIG. 2E. In the step shown in FIG. 3F, the first metal layer 202 is etched off with an acidic or alkaline solution, whereby the nanocarbon layer 201 and the second metal layer 203 are patterned. When the first metal layer 202 contains zinc or tin and the second metal layer 203 contains copper, only the second metal layer 203 and the nanocarbon layer 201 can be patterned with an alkaline solution because the first metal layer 202 is selectively etched off with such an alkaline solution.

Field Effect Transistor Including Carbon Nanotubes

Field effect transistors including semiconductor layers containing carbon nanotubes can be readily fabricated by the procedure including the steps shown in FIG. 2A to 2F.

Figure 4A:
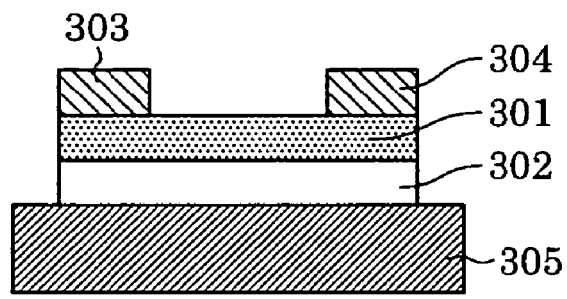
FIGS. 4A, 4B, and 4C are schematic sectional views showing configurations of three types of field effect transistor fabricated using the process of the present invention.
Figure 4B:
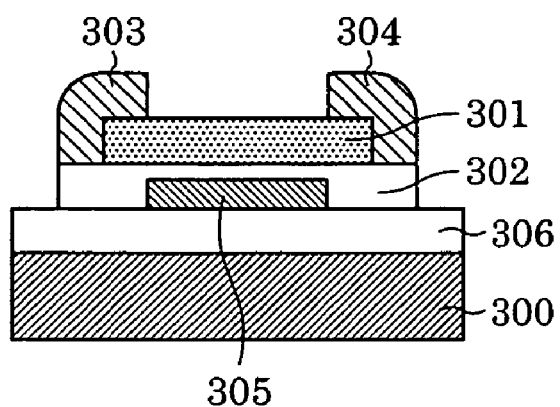
Figure 4C:
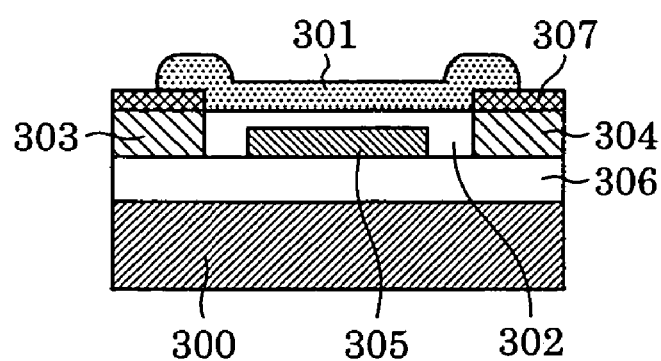

FIGS. 4A, 4B, and 4C are schematic sectional views showing configurations of three types of field effect transistor, fabricated by the process of the present invention, including a semiconductor layer containing carbon nanotubes. With reference to FIGS. 4A to 4C, reference numeral 300 represents substrates, reference numeral 301 represents carbon nanotube layers, reference numeral 302 represents gate insulators, reference numeral 303 represents source electrodes, reference numeral 304 represents drain electrodes, reference numeral 305 represents gate electrodes, reference numeral 306 represents insulating layers, and reference numeral 307 represents ohmic contact layers. In the field effect transistor shown in FIG. 4A, the gate electrode 305 includes a heavily doped silicon substrate.

In the process of the present invention, the carbon nanotubes are prepared in advance. Therefore, any catalyst layer containing nickel or another metal need not be formed and any high-melting point material such as molybdenum or tungsten need not be used to fabricate electrodes depending on the temperature at which the carbon nanotubes are created in contrast to known processes.

The gate electrodes 305, the source electrodes 303, and the drain electrodes 304 may contain aluminum, copper, or nickel other than a high-melting point material such as molybdenum or tungsten.

The gate insulators 302 may contain silicon dioxide, silicon nitride, tantalum oxide, or another compound and can be formed by a CVD process such as a thermal CVD process a plasma-enhanced CVD process. The substrates 300 may be made of silicon, glass, quartz, sapphire, or another material. The insulating layers 306 may be made of silicon dioxide or another compound. When the substrates 300 are made of silicon, the insulating layers 306 made of silicon dioxide can be formed by thermal oxidation. The ohmic contact layers 307 in contact with the carbon nanotubes may be made of palladium or another material.

Field Emission Display

Figure 6:
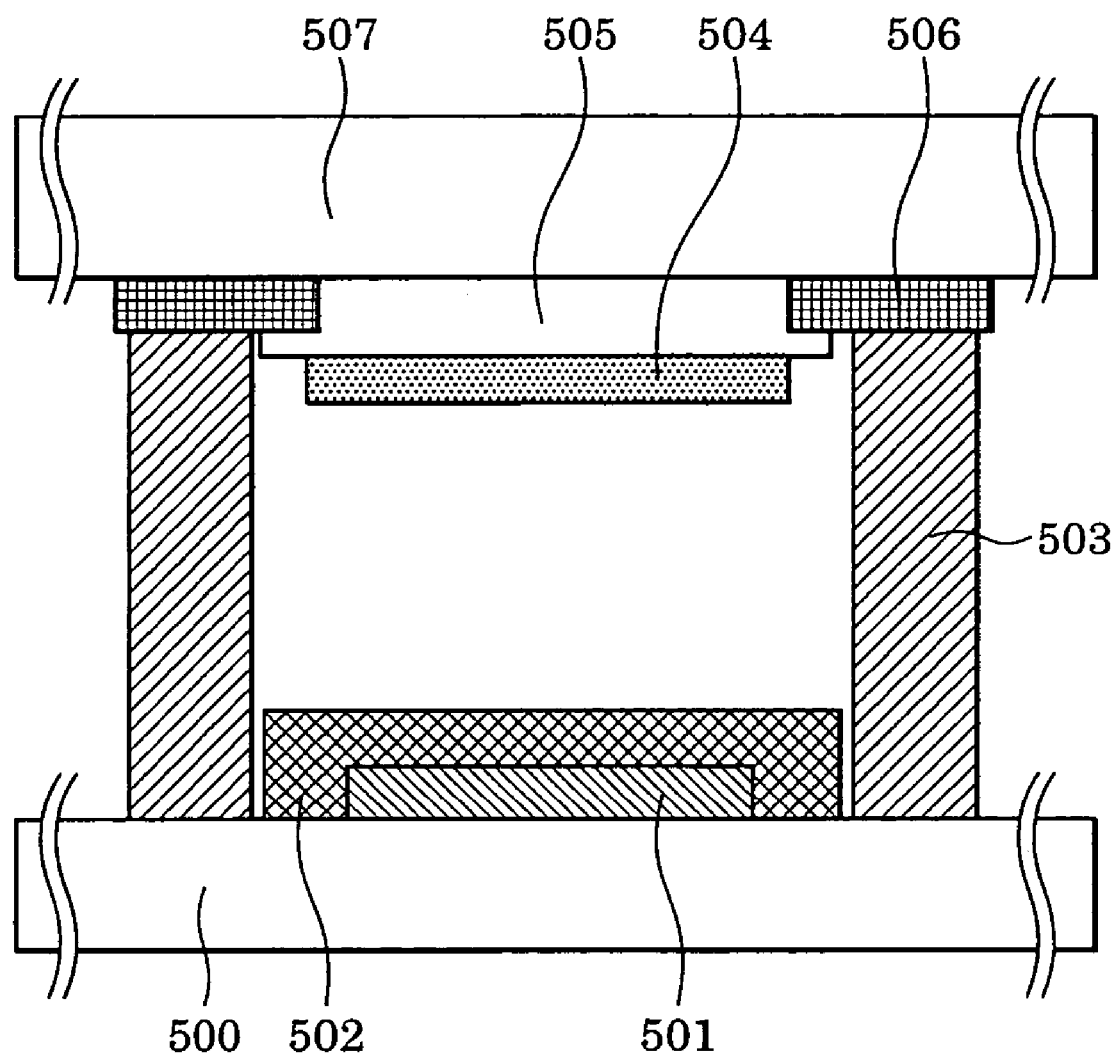
FIG. 6 is a fragmentary sectional view showing a configuration of an FED prepared by patterning a nanocarbon material by the process of the present invention.

FIG. 6 is a fragmentary sectional view showing a configuration of an FED. With reference to FIG. 6, the FED includes an insulating substrate 500 made of glass, rear electrodes 501 functioning as cathode electrodes, nanocarbon layers 502 functioning as cathodes, insulating spacers 503 functioning as partitions, fluorescent layers 504, transparent electrodes 505 functioning as anodes, a front mask 506, and a transparent front plate 507 made of glass.

The FED can be prepared by the following procedure: the rear electrodes 501 are formed on the insulating substrate 500; the nanocarbon layers 502 are each provided on the corresponding rear electrodes 501 by patterning a nanocarbon film containing a nanocarbon material such as carbon nanotubes or carbon nanofibers by the process of the present invention; the transparent electrodes 505 are formed on the transparent front plate 507; the fluorescent layers 504 are each formed on the corresponding transparent electrodes 505; the fluorescent layers 504 are each formed on the corresponding transparent electrodes 505 by a vapor deposition process or a printing process using an inkjet printer; the transparent electrodes 505 are each aligned with the corresponding nanocarbon layers 502; the insulating spacers 503 are provided between the insulating substrate 500 and the transparent front plate 507; and the spaces defined by the insulating spacers 503, the insulating substrate 500, and the transparent front plate 507 are evacuated to a vacuum pressure and then hermetically sealed.

As described above, the process of the present invention is useful in manufacturing devices such as transistors including semiconductor layers containing carbon nanotubes, circuits including electrical wires containing carbon nanotubes, and field emission displays including electron emission sites containing carbon nanotubes.

According to the process of the present invention, such devices taking advantage of a nanocarbon material can be readily manufactured at low cost.

EXAMPLES

Examples of the present invention will now be described, although the invention is not limited to the examples.

Procedure for Preparing Dispersion Containing Carbon Nanotubes

A procedure for preparing a dispersion, used in the examples and comparative examples described below, containing carbon nanotubes will now be described.

Figure 5:
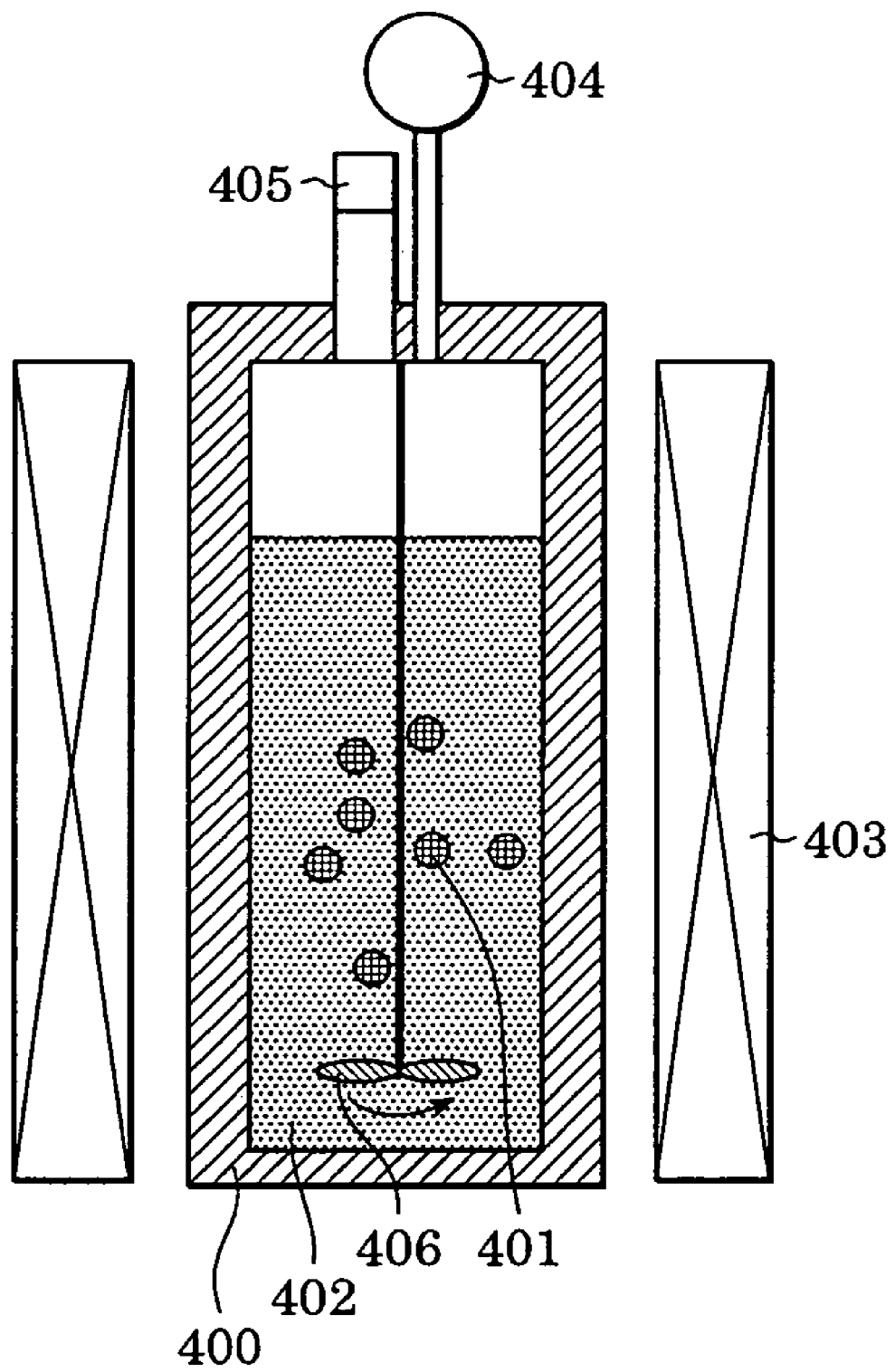
FIG. 5 is a schematic sectional view showing a configuration of a reactor used to prepare a dispersion containing a nanocarbon material.

FIG. 5 is a schematic sectional view showing a configuration of a reactor used to prepare the dispersion. With reference to FIG. 5, the reactor includes a high-temperature, high-pressure reaction vessel 400, made of Hastelloy® (Ni—Mo alloy), having a capacity of 95 ml; a heater 403; a pressure gauge 404; a relief valve 405, and an agitator 406, which may be omitted as required. Carbon nanotubes 401 and a solution 402 containing a solvent and a surfactant are placed in the reaction vessel 400.

Into the reaction vessel 400, 0.2 g of single-wall carbon nanotubes, 0.8 g of an aqueous solution containing 25% of ammonium lauryl sulfate acting as a surfactant, and 22.5 g of ion-exchanged water were fed. These compounds were mixed and the reaction vessel 400 was then hermetically sealed. The mixture was subjected to reaction by maintaining the mixture for six hours at 450° C. and 28 Pa. The reaction vessel 400 was cooled to room temperature and then opened. The reaction mixture was blended with isopropyl alcohol and the blend was ultrasonically treated to disperse the carbon nanotubes in the isopropyl alcohol. A solid portion and a liquid portion were isolated from the blend, whereby a dispersion containing isopropyl alcohol and the single-wall carbon nanotubes dispersed therein was obtained.

A silicon substrate was coated with the dispersion prepared by the above procedure, dried, and then observed with a scanning electron microscope. The observation showed that a carbon nanotube layer was present on the silicon substrate.

Example 1

A wiring pattern was formed by the process of the present invention, whereby an element for measuring the resistance of a wire made of a nanocarbon material was prepared. FIGS. 7A to 7E show steps of preparing the element. With reference to FIGS. 7A to 7E, reference numeral 600 represents an insulating substrate made of Corning 7059 glass, reference numeral 601 represents electrode pads used as measurement terminals, reference numeral 602 represents a nanocarbon layer containing the carbon nanotubes, reference numeral 603 represents a mask layer (first metal layer), and reference numeral 604 represents a photoresist layer.

(1) Magnets were arranged under the rear face of the insulating substrate 600, a Permalloy mask having a negative pattern corresponding to the electrode pads 601 was placed on the front face of the insulating substrate 600, and the electrode pads 601 each including the following layers were formed on the front face of the insulating substrate 600 with an electron beam evaporation system: a Cr layer with a thickness of 50 nm, an Al layer with a thickness of 100 nm, and a Cr layer with a thickness of 50 nm, those layers being arranged in that order.

(2) The dispersion prepared as described above was applied onto the front face of the insulating substrate 600 with a spinner and the resulting insulating substrate 600 was heat-treated at 300° C. in an argon atmosphere. This operation was performed again, whereby the nanocarbon layer 602 was formed on the front face of the insulating substrate 600.

A Cu sub-layer with a thickness of 100 nm was formed on the nanocarbon layer 602 with a sputtering system and a Zn sub-layer with a thickness of 100 nm was then formed on the Cu sub-layer with an electron beam evaporation system, whereby the mask layer 603 including the Cu sub-layer and the Zn sub-layer was formed on the nanocarbon layer 602.

(3) A solution containing a positive photoresist was applied onto the mask layer 603 with a spinner and the mask layer 603 was exposed with an exposure system and then subjected to development, whereby the photoresist layer 604 having a bar shape was formed so as to extend above the electrode pads 601.

(4) The mask layer 603 was patterned so as to have a bar shape in such a manner that the mask layer 603 was etched with an aqueous solution containing ferric chloride ($FeCl_3$) using the photoresist layer 604 as a mask. The insulating substrate 600 was cleaned with water and the photoresist layer 604 was removed with a release agent. The insulating substrate 600 was cleaned with water and then dried.

(5) The nanocarbon layer 602 was etched with a reactive etching system using oxygen plasma in such a manner that a gas mixture of oxygen and argon was fed to the reactive etching system and the mask layer 603 having such a bar shape was used as a mask, whereby the nanocarbon layer 602 was patterned into a nanocarbon wire extending over the electrode pads 601.

Example 2-1

Figure 7A:
FIGS. 7A to 7E are illustrations showing steps of preparing an element for measuring the resistance of a wire prepared by patterning a nanocarbon material by the process of the present invention.
Figure 7B:
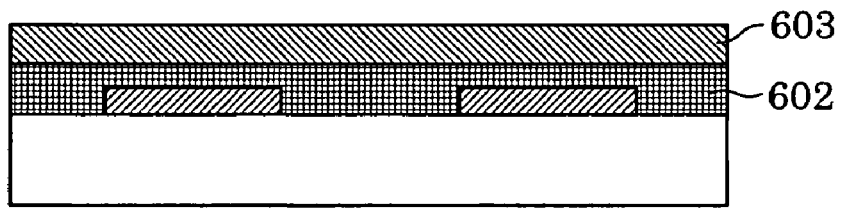
Figure 7C:
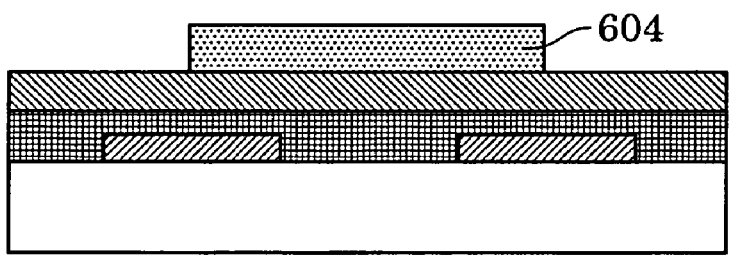
Figure 7D:
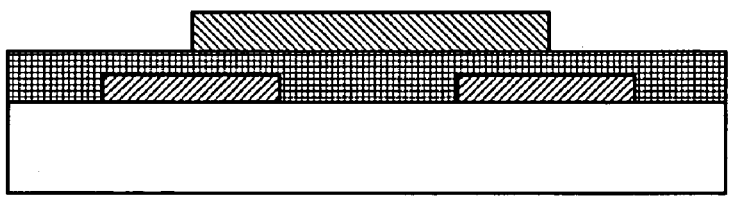
Figure 7E:
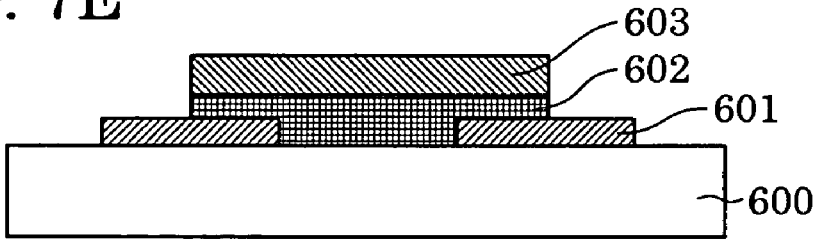

An element including a nanocarbon wire similar to that shown in FIG. 7E was prepared by the same procedure as that described in Example 1 except that a mask layer 603 of this element included no Cu sub-layer nor Zn sub-layer, but did contain Zn, and had a thickness of 200 nm.

Example 2-2

An element having the same configuration as that described in Example 2-1 was prepared and a mask layer 603 of this element was then etched off with ammonia water.

Example 3

An element having the same configuration as that described in Example 2-1 was prepared except that a mask layer 603 of this element contained no Zn but Sn. This mask layer 603 was then etched off with an aqueous solution containing $FeCl_3$.

Example 4

An element having the same configuration as that described in Example 3 was prepared except that a mask layer 603 of this element contained no Sn but In.

Example 5

An element having the same configuration as that described in Example 3 was prepared except that a mask layer 603 of this element contained no Sn but Al. This mask layer 603 was then etched off with an aqueous solution containing phosphoric acid, nitric acid, and acetic acid.

Comparative Example 1

An element having a configuration similar to that described in Example 1 was prepared by a known patterning process as described below.

(1) An insulating substrate 600 made of Corning 7059 glass was prepared. Magnets were arranged under the rear face of the insulating substrate 600, a Permalloy mask having a negative pattern corresponding to electrode pads 601 was placed on the front face of the insulating substrate 600, and the electrode pads 601 each including the following layers were formed on the front face of the insulating substrate 600 with an electron beam evaporation system: a Cr layer with a thickness of 50 nm, an Al layer with a thickness of 100 nm, and a Cr layer with a thickness of 50 nm, those layers being arranged in that order.

(2) The dispersion prepared as described above was applied onto the front face of the insulating substrate 600 with a spinner and the resulting insulating substrate 600 was heat-treated at 300° C. in an argon atmosphere. This procedure was performed again, whereby a nanocarbon layer 602 was formed on the front face of the insulating substrate 600.

A Cu sub-layer with a thickness of 100 nm was formed on the nanocarbon layer 602 with a sputtering system and a $SiO_2$ sub-layer with a thickness of 200 nm was then formed on the Cu sub-layer with an sputtering system, whereby a mask layer 603 including the Cu sub-layer and the $SiO_2$ sub-layer was formed on the nanocarbon layer 602.

(3) A solution containing a positive photoresist was applied onto the mask layer 603 with a spinner and the mask layer 603 was exposed with an exposure system and then subjected to development, whereby a photoresist layer 604 having a bar shape was formed so as to extend above the electrode pads 601.

(4) The mask layer 603 was patterned so as to have a bar shape in such a manner that the mask layer 603 was etched with hydrofluoric acid (HF) using the photoresist layer 604 as a mask. The Cu sub-layer was etched off with an aqueous solution containing $FeCl_3$. The resulting insulating substrate 600 was cleaned with water and then dried.

(5) The nanocarbon layer 602 was etched with a reactive etching system using oxygen plasma in such a manner that a gas mixture of oxygen and argon was fed to the reactive etching system and the mask layer 603 having such a bar shape was used as a mask. The photoresist layer 604 was then removed with a release agent, whereby the nanocarbon layer 602 was patterned into a nanocarbon wire extending over the electrode pads 601.

Comparative Example 2-1

An element having the same configuration as that described in Comparative Example 1 was prepared except that a mask layer 603 of this element included no Cu sub-layer nor $SiO_2$ sub-layer, but did contain $SiO_2$, and had a thickness of 200 nm.

Comparative Example 2-2

An element having the same configuration as that described in Comparative Example 2-1 was prepared and a mask layer 603 of this element was then etched off with HF. The resulting element was cleaned with water and then dried.

Comparative Example 3-1

An element having the same configuration as that described in Comparative Example 1 was prepared except that a mask layer 603 of this element contained no $SiO_2$ but Cu.

Comparative Example 3-2

An element having the same configuration as that described in Comparative Example 3-1 was prepared and a mask layer 603 of this element was then etched off with an aqueous solution containing $FeCl_3$. The resulting element was cleaned with water and then dried.

Evaluation of Appearance by Microscopic Observation

The elements prepared in Examples 1 to 5 and Comparative Examples 1 to 3-2 were observed with an optical microscope, whereby the appearance thereof was evaluated.

The observation showed that no layers of the elements of Examples 1 to 5 were peeled off.

In contrast, the observation showed that the nanocarbon layer 602 of the element of Comparative Example 2-2 was peeled off.

Furthermore, the observation showed that a residue probably containing copper oxide remained on the nanocarbon layer 602 of the element of Comparative Example 3-2. For this element, since the mask layer 603 contains Cu and cannot therefore be readily removed during the patterning of the nanocarbon layer 602, non-uniformity or defects can occur if a desired device is prepared by providing an additional layer on the patterned nanocarbon layer 602. Therefore, the element of Comparative Example 3-2 is not preferable.

Evaluation of Resistance of Wires

The nanocarbon wires of the elements prepared in Examples 1 to 5 and Comparative Examples 1 to 3-2 were evaluated for resistance in such a manner that a direct current was applied between electrode pads 601 and a voltage between the electrode pads 601 was then measured.

The evaluation showed that the nanocarbon wire formed in Comparative Example 1 had a resistance greater than that of the nanocarbon wire formed in Example 1.

The evaluation showed that the nanocarbon wire formed in Comparative Example 2-1 had a resistance greater than that of the nanocarbon wire formed in Example 2-1.

Furthermore, the evaluation showed that the nanocarbon wire formed in Comparative Example 2-2 had a resistance greater than that of the nanocarbon wire formed in Example 2-2. The reason why the nanocarbon wire formed in Comparative Example 2-2 has a higher resistance is probably as follows: the nanocarbon layer 602 was partly etched with oxygen plasma, derived from $SiO_2$, contained in the sputtering atmosphere when the $SiO_2$ sub-layer was formed and the nanocarbon layer 602 was partly peeled off because the insulating substrate 600 under the nanocarbon layer 602 was partly etched when the $SiO_2$ sub-layer was etched with HF.

The evaluation showed that the nanocarbon wire formed in Comparative Example 3-1 had a resistance greater than that of the nanocarbon wire formed in Example 2-1. The reason for this fact is probably that for the element prepared in Comparative Example 3-1, the Cu sub-layer was oxidized during the patterning of the nanocarbon layer 602 and the mask layer 603 therefore had high resistance.

The nanocarbon wires formed in Comparative Examples 1 to 3-2 had a resistance three to ten times greater than that of the nanocarbon wires formed in Comparative Examples 1 to 5 as long as no nanocarbon layers 602 were peeled off during the steps of preparing the elements.

Example 6

A field effect transistor having a cross-sectional structure shown in FIG. 4A was prepared by the procedure below.

A heavily-doped p-type silicon wafer was used as a gate electrode 305. A $SiO_2$ layer with a thickness of 200 nm was formed on the wafer by a low-pressure chemical vapor deposition (LPCVD) process, whereby a gate insulator 302 was prepared. The dispersion was applied onto the gate insulator 302 and the resulting wafer was heat-treated at 600° C. in an argon atmosphere in a manner similar to that described in Example 2-2, whereby a carbon nanotube layer 301 was formed on the gate insulator 302. A mask layer including the following sub-layers was formed on the carbon nanotube layer 301 by an electron beam evaporation process: a Pd sub-layer with a thickness of 20 nm, a Mo sub-layer with a thickness of 100 nm, and a Zn sub-layer with a thickness of 100 nm, those sub-layers being arranged in that order. The carbon nanotube layer 301 was patterned with oxygen plasma using a mask prepared by processing the mask layer. The Zn sub-layer was etched off with ammonia water and the Pd sub-layer and the Mo sub-layer were patterned by a photolithographic process, whereby a source electrode 303 and a drain electrode 304 were formed. This led to the preparation of the transistor. The measurement of the transistor showed that the transistor had desired properties.

Comparative Example 4

A field effect transistor having a cross-sectional structure shown in FIG. 4A was prepared by the same procedure as that described in Example 6 except that a mask layer was formed as follows: a Pd sub-layer with a thickness of 20 nm and a Mo sub-layer with a thickness of 100 nm were formed on a carbon nanotube layer 301 by an electron beam evaporation process in that order and a $SiO_2$ sub-layer with a thickness of 100 nm was then formed on the Mo sub-layer by an LPCVD process.

The carbon nanotube layer 301 was patterned with oxygen plasma using a mask prepared by processing the mask layer. The $SiO_2$ sub-layer was removed with an aqueous solution containing HF. Other components were formed in the same manner as that described in Example 6.

Since a gate insulator 302 of this transistor was partly etched during the removal of the $SiO_2$ sub-layer, this transistor had unsatisfactory properties.

As described above, the process of the present invention is useful in manufacturing various devices including a nanocarbon material, the devices having a wide range of applications.

According to the process of the present invention, a nanocarbon material can be patterned without deteriorating or damaging the nanocarbon material; hence, high-performance semiconductor devices, such as FETs and FEDs, including nanocarbon materials can be manufactured.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2004-162966 filed Jun. 1, 2004, which is hereby incorporated by reference herein.

What is claimed is:

1. A process for patterning a nanocarbon material, comprising:
   a step of forming a nanocarbon layer on a substrate;
   a step of forming a first metal layer on the nanocarbon layer to pattern the first metal layer, the first metal layer containing at least zinc; and
   a step of etching the nanocarbon layer with oxygen plasma using the first metal layer as a positive pattern, wherein the step of forming the nanocarbon layer includes a sub-step of applying a dispersion containing a nanocarbon material onto the substrate and then heat-treating the substrate.

2. The process according to claim 1, wherein the dispersion is prepared by heat-treating a mixture at high temperature and pressure, the mixture containing the nanocarbon material, a solvent, a surfactant, and a compound of at least one selected from the group consisting of a calixarene, cyclodextrin, and cyclophane.

3. The process according to claim 2, wherein the dispersion is prepared by treating the mixture at a temperature higher than the critical temperature of the solvent under supercritical conditions.

4. The process according to claim 1, wherein the first metal layer treated with the oxygen plasma is etched off with acid and/or alkali.

5. The process according to claim 1, wherein the nanocarbon material comprises carbon nanotubes.

6. A method for manufacturing a semiconductor device including a semiconductor layer containing a nanocarbon material, the method comprising:
   a step of patterning a nanocarbon material by the process according to claim 1.

7. A method for manufacturing a semiconductor device including a wire or electrode having a conductor layer containing a nanocarbon material, the method comprising:
   a step of patterning a nanocarbon material by the process according to claim 1.

8. A process for patterning a nanocarbon material according to claim 1, further comprising a step of forming a second metal layer on the nanocarbon layer before forming the first metal layer.

* * * * *

UNITED STATES PATENT AND TRADEMARK OFFICE
CERTIFICATE OF CORRECTION

| | | |
|---|---|---|
| PATENT NO. | : 7,399,703 B2 | Page 1 of 1 |
| APPLICATION NO. | : 11/138331 | |
| DATED | : July 15, 2008 | |
| INVENTOR(S) | : Soichiro Kawakami | |

It is certified that error appears in the above-identified patent and that said Letters Patent is hereby corrected as shown below:

<u>COLUMN 2</u>

Lines 5-6, "carbon and" should read -- carbon, so a --.

<u>COLUMN 4</u>

Line 18, "nono-" should read -- nano- --.

<u>COLUMN 8</u>

Line 51, "process a" should read -- process or a --.

Signed and Sealed this

Second Day of December, 2008

JON W. DUDAS
*Director of the United States Patent and Trademark Office*